United States Patent
Wei et al.

(10) Patent No.: US 7,893,931 B2
(45) Date of Patent: Feb. 22, 2011

(54) DISPLAY DEVICE AND SHIFT REGISTER ARRAY FOR DRIVING A PIXEL ARRAY

(75) Inventors: Chun-Chin Wei, Taipei (TW); Yen-Hsien Yeh, Yonghe (TW); Shih Hsun Lo, Hsinchu County (TW)

(73) Assignee: Au Optronics Corp., Hsinchu (TW)

( * ) Notice: Subject to any disclaimer, the term of this patent is extended or adjusted under 35 U.S.C. 154(b) by 866 days.

(21) Appl. No.: 11/836,280

(22) Filed: Aug. 9, 2007

(65) Prior Publication Data

US 2008/0043006 A1 Feb. 21, 2008

(30) Foreign Application Priority Data

Aug. 16, 2006 (TW) .............................. 95130056 A

(51) Int. Cl.
*G06F 3/038* (2006.01)
(52) U.S. Cl. ...................... 345/205; 345/76; 345/82; 345/204; 345/93; 327/526; 349/192
(58) Field of Classification Search .............. 345/30, 345/76, 82, 83, 93–100, 204; 327/526; 349/192; 377/64–81; 315/169.3; 313/463
See application file for complete search history.

(56) References Cited

U.S. PATENT DOCUMENTS

| | | | |
|---|---|---|---|
| 511,060 A | | 12/1893 | Platshek |
| 5,063,378 A | * | 11/1991 | Roach .......................... 345/90 |
| 5,111,060 A | * | 5/1992 | Asada .......................... 327/526 |
| 5,781,171 A | * | 7/1998 | Kihara et al. ................. 345/93 |
| 2005/0276369 A1 | * | 12/2005 | Mutaguchi ................... 377/64 |

FOREIGN PATENT DOCUMENTS

JP 1125951 5/1989

OTHER PUBLICATIONS

English language translation of abstract of JP 1125951.

* cited by examiner

*Primary Examiner*—Lun-Yi Lao
*Assistant Examiner*—Carolyn R Edwards
(74) *Attorney, Agent, or Firm*—Thomas, Kayden, Horstemeyer & Risley, LLP

(57) ABSTRACT

A shift register array includes a plurality of first shift registers, a second shift register, a first connection line, a second connection line, and a third connection line. A signal output terminal of each first shift register overlaps the first connection line and the third connection line without electric connection. The first connection line is connected to a signal input terminal of the second shift register. The second connection line is connected to a signal output terminal of the second shift register, and establishes a plurality of electric connection paths. When one of the first shift registers malfunctions, the corresponding connection points and overlapping points are cut or connected so that the malfunctioned first shift register can be replaced by the second shift register.

21 Claims, 5 Drawing Sheets

DISPLAY DEVICE AND SHIFT REGISTER ARRAY FOR DRIVING A PIXEL ARRAY

This application claims the benefit of priority based on Taiwan Patent Application No. 095130056 filed on Aug. 16, 2006, the disclosure of which is incorporated herein by reference in its entirety.

CROSS-REFERENCES TO RELATED APPLICATIONS

Not applicable.

BACKGROUND OF THE INVENTION

1. Field of the Invention

The present invention relates to a display device and a shift register array for driving a pixel array, and more specifically, to a display device and a shift register array for replacing a malfunctioned shift register.

2. Descriptions of the Related Art

In recent years, the development of flat panel displays progresses more and more rapidly as having gradually taken the place of traditional cathode ray tube displays. Current flat panel displays include organic light-emitting displays (OLEDs), plasma display panels (PDPs), liquid crystal displays (LCDs) and field emission displays (FEDs). No matter what type it is, a shift register array thereof has to supply a driving signal for scan lines of the pixel array to function the flat panel display normally.

FIG. 1 is a schematic diagram illustrating a flat panel display of the prior art. The flat panel display 1 comprises a pixel array 11, a peripheral circuit 13, and a shift register array 15. The pixel array 11 comprises a plurality of scan lines (only shown as 111, 112, . . . , 116 for the sake of simplification) and data lines (only shown as 131, 132, . . . , 136 for the sake of simplification). The shift register array 15 comprises a plurality of shift registers (only shown as 151, 152, . . . , 156 for the sake of simplification), wherein each shift register drives a scan line. The peripheral circuit 13 drives the data lines 131, 132, . . . , 136. The shift registers 151, 152, . . . , 156, connected together in series, comprise thin-film transistors 1511, 1521, . . . , 1561, respectively. Except the first stage shift register 151 which is activated by an activation signal 10 that is directly received by a signal input terminal 1513 of the same, signal input terminals 1523, 1533, 1543, 1553, 1563 of other stage shift registers 152, . . . , 156 respectively receive driving signals outputted from signal output terminals 1515, 1525, 1535, 1545, 1555 of the previous stage shift registers as the activation signals. The signal output terminals 1515, 1525, 1535, 1545, 1555, 1565 are also connected to the scan lines 111, 112, . . . , 116 respectively to drive the scan lines. The shift registers 151, 152, . . . , 156 further receive a positive clock CK, a negative clock XCK, and a DC power source $V_{SS}$ to function. The received clocks of the thin-film transistors of the adjacent shift registers must be opposite. For example, the thin-film transistors 1511, 1531, 1551 of the odd stage shift registers 151, 153, 155 receive the positive clock CK, and the thin-film transistors 1521, 1541, 1561 of the even stage shift registers 152, 154, 156 receive the negative clock XCK. Therefore, the activation signal 10 can be passed down stage by stage, and the scan lines 112, 112, . . . , 116 can be driven sequentially.

If one of the shift registers malfunctions during the manufacturing process shown as the shift register 153 in FIG. 1, the corresponding scan line 113 can not be driven. Moreover, the operations of the following shift registers are also influenced since they are connected in series. When the panel size is large or the resolution is high, the influence of the above-mentioned situation will be more serious. Therefore, it is an objective in improving the production yield of manufacturing the flat panel displays and providing a backup solution to making up the malfunction.

SUMMARY OF THE INVENTION

One objective of this invention is to provide a display device, which comprises a pixel array and a shift register array. The pixel array comprises a plurality of scan lines. The shift register array comprises a plurality of first shift registers, a second shift register, a first connection line, a second connection line, and a third connection line. Each first shift register comprises a signal input terminal and a signal output terminal which is predetermined to be electrically connected with corresponding one of the scan lines. The second shift register comprises a signal input terminal and a signal output terminal. The first connection line is connected to the signal input terminal of the second shift register, and overlaps the signal output terminal of each first shift register without electric connection. The second connection line is connected to the signal output terminal of the second shift register. The third connection line establishes a plurality of electric connection paths with the second connection line, and overlaps the signal output terminal of each first shift register without electric connection. The number of the electric connection paths is the same as the number of the first shift registers.

When one of the first shift registers malfunctions, the overlapping point of the signal output terminal of a previous stage of the malfunctioned first shift register and the first connection line is electrically connected to the first connection line. The overlapping point of the signal output terminal of the malfunctioned first shift register is electrically connected to the third connection line. The electric connection of the signal output terminal of the malfunctioned first shift register and the corresponding scan line is adjusted to electric disconnection.

Another objective of this invention is to provide a display device, which comprises a pixel array and a shift register array. The pixel array comprises a plurality of scan lines. The shift register array comprises a plurality of first shift registers, a positive clock signal connection line, a negative clock signal connection line, a second shift register, a third shift register, a first connection line, a second connection line, and a third connection line. Each first shift register comprises a signal input terminal and a signal output terminal which is predetermined to be electrically connected with corresponding one of the scan lines. The positive clock signal connection line supplies a positive clock to the first shift registers. The negative clock signal connection line supplies a negative clock to the first shift registers. The second shift register comprises a signal input terminal, a signal output terminal, a first clock input terminal, and a second clock input terminal. The first clock input terminal of the second shift register is electrically connected to the positive clock signal connection line, and the second clock input terminal of the same is electrically connected to the negative clock signal connection line. The third shift register comprises a signal input terminal, a signal output terminal, a first clock input terminal, and a second clock input terminal. The first clock input terminal of the third shift register is electrically connected to the negative clock signal connection line, and the second clock input terminal of the same is electrically connected to the positive clock signal connection line. The first connection line is connected to the signal input terminals of the second shift register and the third shift register, and overlaps the signal output terminal of each first shift register without electric connection. The second connection line overlaps the signal output terminals of the second shift register and the third shift register without electric connection. The third connection line establishes a plurality of electric connection paths with the second connection line, and overlaps the signal output terminal of each first shift register without electric connection. The number of the electric connection paths is the same as the number of the first shift registers.

When one of the first shift registers malfunctions, the second shift register or the third shift register is determined as a replacement shift register according to a clock connection manner of the malfunctioned first shift register. The overlapping point of the signal output terminal of a previous stage of the malfunctioned first shift register is electrically connected to the first connection line. The overlapping point of the signal output terminal of the malfunctioned first shift register is electrically connected to the third connection line. The electric connection of the signal output terminal of the malfunctioned first shift register and the corresponding scan line is adjusted to electric disconnection. The overlapping point of the signal output terminal of the replacement shift register is electrically connected to the second connection line.

Another objective of this invention is to provide a shift register array for driving a pixel array comprising a plurality of scan lines. The shift register array comprises a plurality of first shift registers, a second shift register, a first connection line, a second connection line, and a third connection line. Each first shift register comprises a signal input terminal and a signal output terminal which is predetermined to be electrically connected with the corresponding one of the scan lines. The second shift register comprises a signal input terminal and a signal output terminal. The first connection line is connected to the signal input terminal of the second shift register, and overlaps the signal output terminal of each first shift register without electric connection. The second connection line is connected to the signal output terminal of the second shift register. The third connection line establishes a plurality of electric connection paths with the second connection line, and overlaps the signal output terminal of each first shift register without electric connection. The number of the electric connection paths is the same as the number of the first shift registers.

When one of the first shift registers malfunctions, the overlapping point of the signal output terminal of a previous stage of the malfunctioned first shift register is electrically connected to the first connection line. The overlapping point of the signal output terminal of the malfunctioned first shift register is electrically connected to the third connection line. The electric connection of the signal output terminal of the malfunctioned first shift register and the corresponding scan line is adjusted to electric disconnection.

Another objective of this invention is to provide a shift register array for driving a pixel array comprising a plurality of scan lines. The shift register array comprises a plurality of first shift registers, a positive clock signal connection line, a negative clock signal connection line, a second shift register, a third shift register, a first connection line, a second connection line, and a third connection line. Each first shift register comprises a signal input terminal and a signal output terminal which is predetermined to be electrically connected with corresponding one of the scan lines. The positive clock signal connection line supplies a positive clock to the first shift registers. The negative clock signal connection line supplies a negative clock to the first shift registers. The second shift register comprises a signal input terminal, a signal output terminal, a first clock input terminal, and a second clock input terminal. The first clock input terminal of the second shift register is electrically connected to the positive clock signal connection line, and the second clock input terminal of the same is electrically connected to the negative clock signal connection line. The third shift register comprises a signal input terminal, a signal output terminal, a first clock input terminal, and a second clock input terminal. The first clock input terminal of the third shift register is electrically connected to the negative clock signal connection line, and the second clock input terminal of the same is electrically connected to the positive clock signal connection line. The first connection line is connected to the signal input terminals of the second shift register and the third shift register, and overlaps the signal output terminal of each first shift register without electric connection. The second connection line overlaps the signal output terminals of the second shift register and the third shift register without electric connection. The third connection line establishes a plurality of electric connection paths with the second connection line, and overlaps the signal output terminal of each first shift register without electric connection. The number of the electric connection paths is the same as the number of the first shift registers.

When one of the first shift registers malfunctions, the second shift register or the third shift register is determined as a replacement shift register according to a clock connection manner of the malfunctioned first shift register. The overlapping point of the signal output terminal of a previous stage of the malfunctioned first shift register is electrically connected to the first connection line. The overlapping point of the signal output terminal of the malfunctioned first shift register is electrically connected to the third connection line. The electric connection of the signal output terminal of the malfunctioned first shift register and the corresponding scan line is adjusted to electric disconnection. The overlapping point of the signal output terminal of the replacement shift register is electrically connected to the second connection line.

The present invention replaces the shift register malfunctioned during the manufacturing process by preparing at least one replacement shift register. If a malfunctioned shift register is discovered during a display device is manufactured, the overlapping points and the connection lines would be adjusted accordingly so that the malfunctioned shift register can be replaced by the replacement shift register. The goal that the display device functions normally can be achieved.

The detailed technology and preferred embodiments implemented for the subject invention are described in the following paragraphs accompanying the appended drawings for people skilled in this field to well appreciate the features of the present invention.

DESCRIPTION OF THE PREFERRED EMBODIMENT

In this specification, the term "overlap" is defined as that two wires or two ends are "contact" without a current passing or a voltage sharing. The term "contact" is not limited to "touching directly" between the two wires or the two ends. That is, the term "contact" also means that the two wires or the two ends are touched indirectly via any intermediary. For example, when two ends of a wire touch the two wires respectively, the two wires "contact" to each other. In addition, the term "according to" is defined as "replying to" or "reacting to." For example, "according to a signal" means "replying to a signal" or "reacting to a signal" without necessity of direct signal reception.

Figure 1:
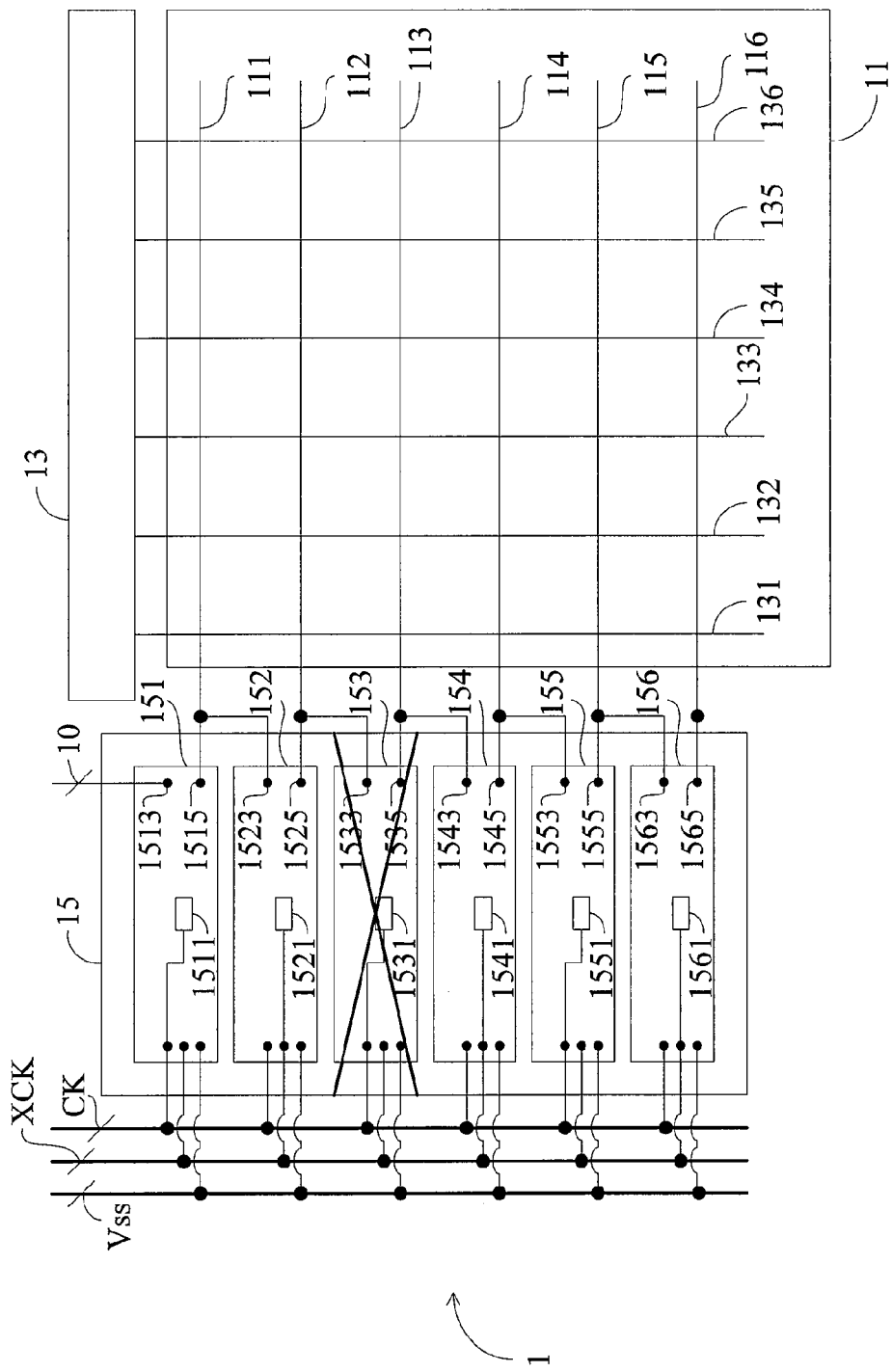
FIG. 1 is a schematic diagram illustrating a flat panel display of the prior art.
Figure 2:
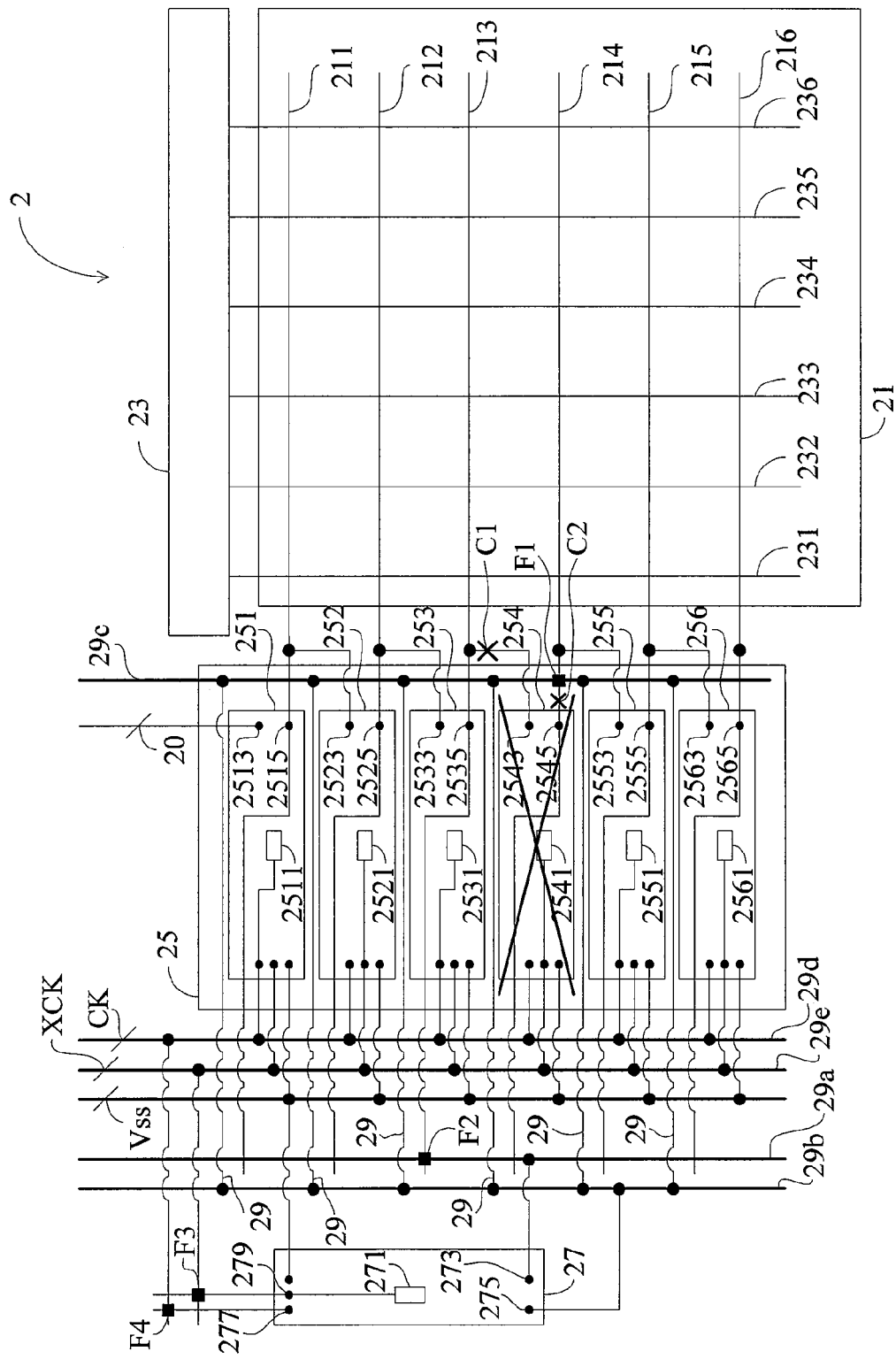
FIG. 2 is a schematic diagram illustrating a first embodiment of the present invention.

As shown in FIG. 2, the first embodiment of the present invention discloses a flat panel display device 2. The flat panel display device 2 comprises a pixel array 21, a peripheral circuit 23, a shift register array 25, a second shift register 27, a first connection line 29a, a second connection line 29b, a third connection line 29c, a positive clock connection line 29d, a negative clock connection line 29e, and a power supply line for supplying a power source $V_{SS}$. The pixel array 21 comprises a plurality of scan lines (only shown as 211, 212, . . . , 216 for the sake of simplification) and data lines (only shown as 231, 232, . . . , 236 for the sake of simplification). The shift register array 25 comprises a plurality of first shift registers (only shown as 251, 252, . . . , 256 for the sake of simplification). The first shift registers 251, 252, . . . , 256 are used to drive the corresponding scan lines 211, 212, . . . , 216, and comprise thin-film transistors 2511, 2521, . . . , 2561 respectively. And the first shift registers 251, 252, . . . , 256 are connected together in series. Except that a signal input terminal 2513 of the first stage shift register 251 is activated by an activation signal 20, the signal input terminals 2523, 2533, . . . , 2563 of other stage shift registers 252, 253, . . . , 256 respectively receive a square wave signal outputted from signal output terminals 2515, 2525, . . . , 2555 of previous stage shift registers 251, 252, . . . , 255 as an activation signal. The first shift registers 251, 252, . . . , 256 receive a positive clock CK through the positive clock connection line 29d and a negative clock XCK through the negative clock connection line 29e. The received positive clock and negative clock of the thin-film transistors of the adjacent shift registers must be opposite. In this embodiment, the thin-film transistors 2511, 2531, 2551 of the odd stage shift registers 251, 253, 255 receive the positive clock CK, and the thin-film transistors 2521, 2541, 2561 of the even stage shift registers 252, 254, 256 receive the negative clock XCK.

In the first embodiment, the structure of the second shift register 27 and the structure of the first shift registers 251, 252, . . . , 256 are the same. The signal input terminal 273 of the second shift register 27 is connected to the first connection line 29a. Each of the signal output terminals 2515, 2525, . . . , 2565 of the first shift registers 251, 252, . . . , 256 overlaps the first connection line 29a without electric connection. The signal output terminal 275 of the second shift register 27 and the second connection line 29b are connected. The third connection line 29c establishes a plurality of electric connection paths 29 with the second connection line 29b. As FIG. 2 shows, each of the first shift registers 251, 252, . . . , 256 corresponds to one electric connection path 29. Furthermore, each of the signal output terminals 2515, 2525, . . . , 2565 overlaps the corresponding electric connection path 29 without electric connection. The second shift register 27 comprises a first clock input terminal 277 for controlling operations of other parts of the second shift register 27 and a second clock input terminal 279 for controlling a thin-film transistor 271. In general, the clock signal received by the first clock input terminal 277 and the clock signal received by the second clock input terminal 279 are opposite. The positive clock connection line 29d and the negative clock connection line 29e overlap the first clock input terminal 277 and the second clock input terminal 279 respectively without electric connection.

When one of the first shift register, such as the shift register 254, malfunctions, the connection of the signal input terminal 2543 of the shift register 254 and the signal output terminal 2535 of the previous stage shift register 253 is cut by a laser beam (shown as "C1" in the FIG. 2). The overlapping point of the third connection line 29c and the signal output terminal 2545 of the shift register 254 is electrically connected or fused (shown as "F1" in the FIG. 2). The connection of the signal output terminal 2545 of the shift register 254 and the corresponding scan line 214 is cut by a laser beam (shown as "C2" in the FIG. 2). The overlapping point of the first connection line 29a and the signal output terminal 2535 of the previous stage shift register 253 is electrically connected or fused (shown as "F2" in the FIG. 2). Finally, the clock connection line connected to the thin-film transistor 271 of the second shift register 27 is determined according to the clock signal received by the thin-film transistor 2541 of the shift register 254. More specifically, because the thin-film transistor 2541 receives the negative clock XCK, the overlapping point of the second clock input terminal 279 and the negative clock connection line 29e is electrically connected or fused (shown as "F3" in the FIG. 2), and the overlapping point of the first clock input terminal 277 and the positive clock connection line 29d is electrically connected or fused (shown as "F4" in the FIG. 2). Accordingly, the malfunctioned shift register 254 can be replaced by the second shift register 27.

In this embodiment, there is one second shift register set for a plurality of first shift registers so that the space would not be wasted. Normally, the number of 50-100 first shift registers arranges one second shift register. More particularly, the number of 50, 60, 70, 80, 90, or 100 first shift registers arranges one second shift register. However, people skilled in this field may use any number of the first shift registers to arrange a second shift register for achieving the goal of this invention.

Figure 3:
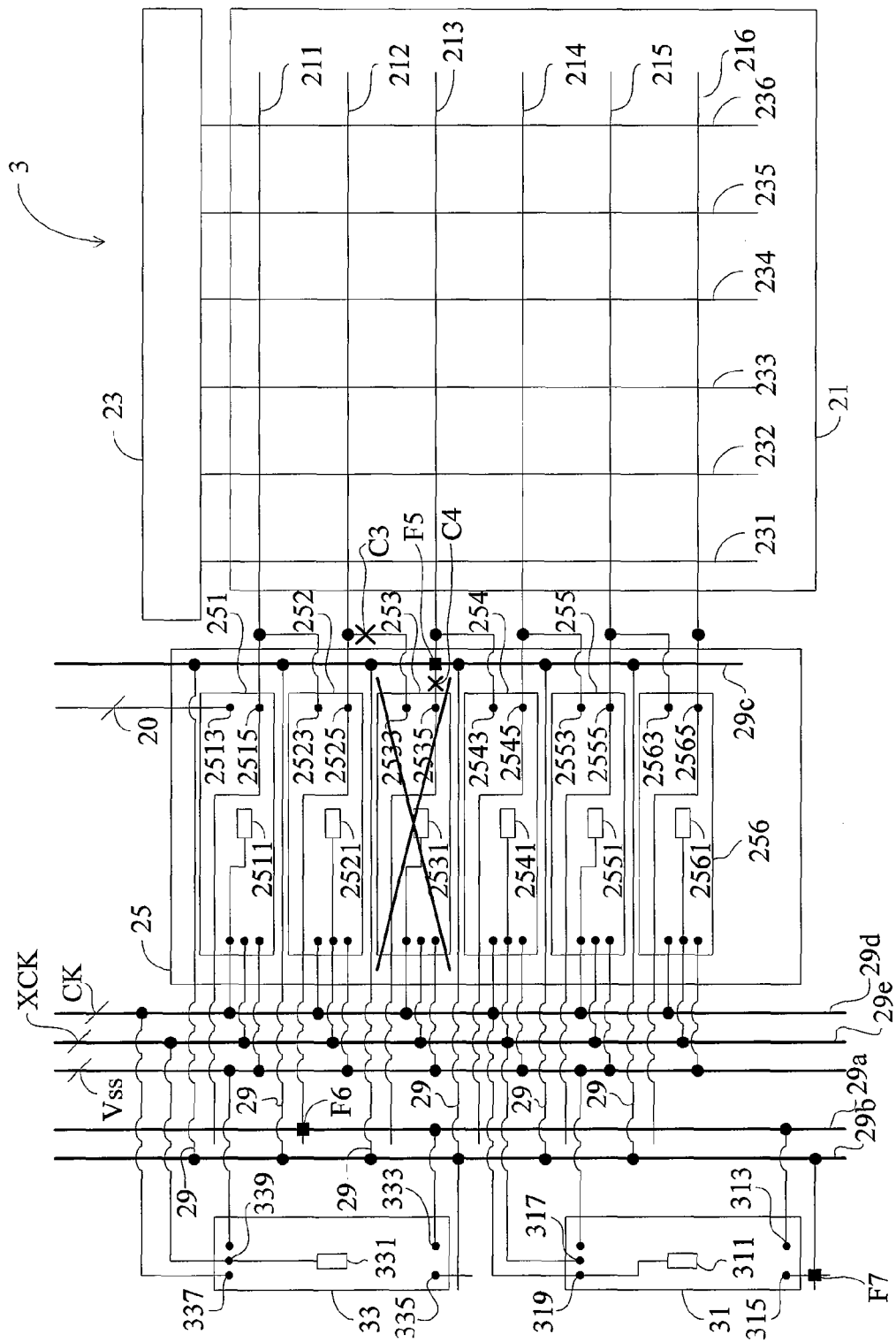
FIG. 3 is a schematic diagram illustrating a second embodiment of the present invention.

As shown in FIG. 3, a second embodiment of the present invention is a flat panel display device 3 which is similar to the first embodiment. The difference is that the second embodiment comprises two backup shift registers: a second shift register 31 and a third shift register 33. The second shift register 31 is configured to replace the odd stage first shift registers 251, 253, 255, and the third shift register 33 is configured to replace the even stage first shift registers 252, 254, 256.

The signal input terminals 313, 333 of the second and the third shift register 31, 33 are connected to the first connection line 29a, and the signal output terminals 315, 335 of the same overlap the second connection line 29b without electric connection. The negative clock connection line 29e is connected to the first signal input terminal 317 of the second shift register 31 and the second signal input terminal 339 of the third shift register 33. The positive clock connection line 29d is connected to the second signal input terminal 319 of the second shift register 31 and the first signal input terminal 337 of the third shift register 33. The rest connections are similar to the corresponding connections of the first embodiment.

When one of the first shift registers 251, 252, ..., 256 malfunctions, the second shift register 31 or the third shift register 33 is determined as a replacement shift register according to a clock connection manner of the malfunctioned first shift register. For example, when the shift register 253 malfunctions, the clock connection manner of the shift register 253 is the same as that of the second shift register 31 since the shift register 253 is an odd stage shift register. Therefore, the second shift register 31 is the replacement shift register. First, the connection of the signal input terminal 2533 of the shift register 253 and the signal output terminal 2525 of the previous stage shift register 252 is cut by a laser beam (shown as "C3" in the FIG. 3). Second, the connection of the signal output terminal 2535 of the shift register 253 and the corresponding scan line 213 is cut by a laser beam (shown as "C4" in the FIG. 3). Then, the overlapping point of the third connection line 29c and the signal output terminal 2535 of the shift register 253 is electrically connected or fused (shown as "F5" in the FIG. 3). In addition, the overlapping point of the first connection line 29a and the signal output terminal 2525 of the previous stage shift register 252 is electrically connected or fused (shown as "F6" in the FIG. 3). Finally, the overlapping point of the second connection line 29b and the signal output terminal 315 of the second shift register 31 is electrically connected or fused (shown as "F7" in the FIG. 3). Accordingly, the malfunctioned shift register 253 can be replaced by the second shift register 31.

If one of the even stage shift registers, such as the shift register 252, malfunctions, the third shift register 33 is the replacement shift register.

In the second embodiment, there are one second shift register and one third shift register set for a plurality of first shift registers. Normally, the number of 50-100 first shift registers arranges a second shift register and a third shift register. More particularly, the number of 50, 60, 70, 80, 90, or 100 first shift registers arranges a second shift register and a third shift register. However, people skilled in this field may use any number of the first shift registers to arrange a second shift register and a third shift register for achieving the goal of this invention.

Figure 4:
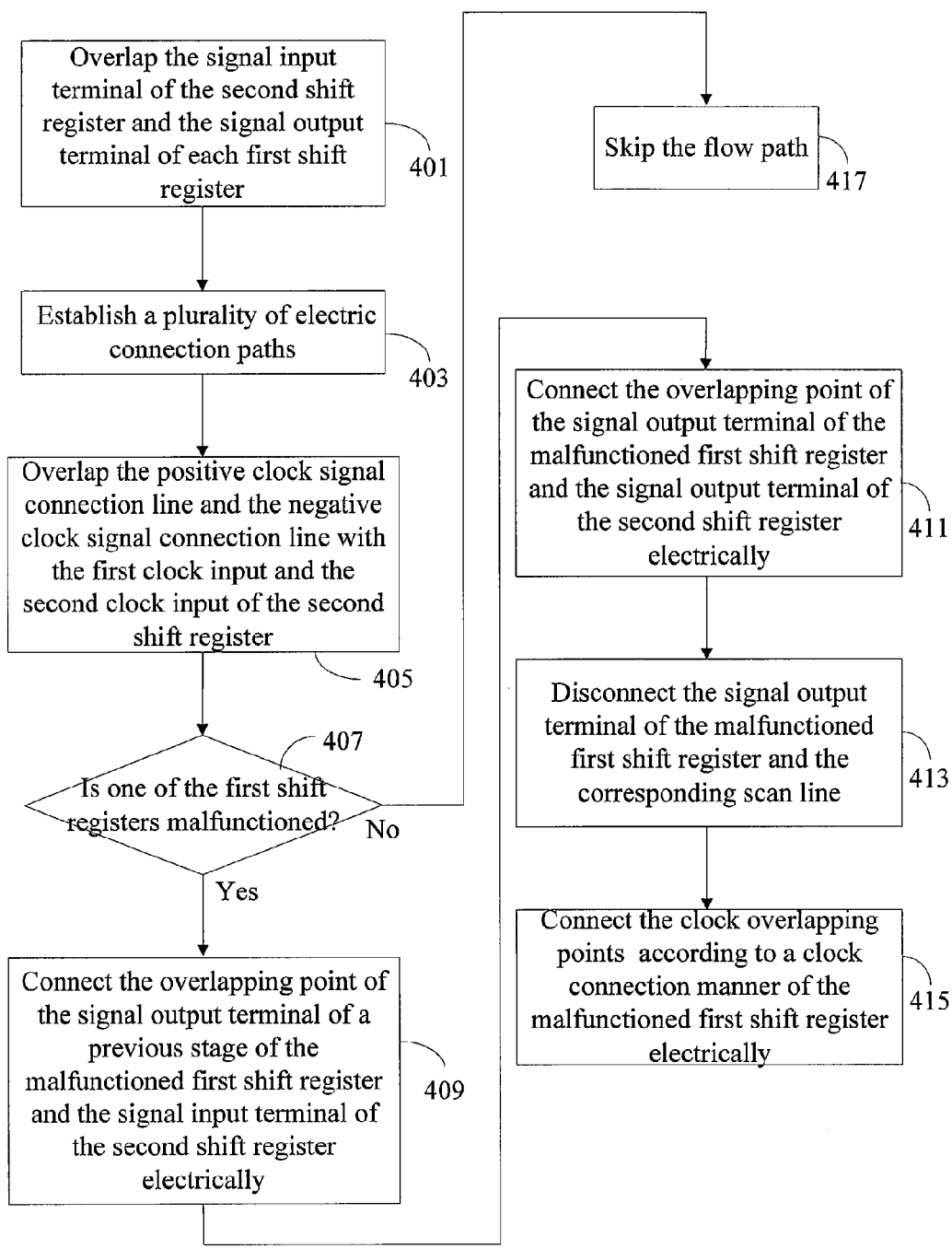
FIG. 4 is a flow chart illustrating a third embodiment of the present invention.

As shown in FIG. 4, a third embodiment of the present invention is a method for driving a pixel array by a shift register array in a display device, such as the display device 2 of the first embodiment. The method is described as follows.

In step 401, the signal input terminal of the second shift register overlaps the signal output terminal of each first shift register without electric connection. In step 403, a number of electric connection paths are established, wherein each electric connection path overlaps the signal output terminal of the second shift register and the signal output terminal of one of the first shift registers without electric connection. The number of the electric connection paths is the same as the number of the first shift registers. In step 405, the positive clock signal connection line and the negative clock signal connection line overlap the first clock input terminal and the second clock input terminal respectively without electric connection. In step 407, one of the first shift registers is determined whether malfunctioning. If yes, step 409 is executed in which the overlapping point of the signal output terminal of a previous stage of the malfunctioned first shift register and the signal input terminal of the second shift register is electrically connected. In step 411, the overlapping point of the signal output terminal of the malfunctioned first shift register and the signal output terminal of the second shift register is electrically connected. Then step 413 is executed in which the electric connection of the signal output terminal of the malfunctioned first shift register and the corresponding scan line is adjusted to electric disconnection. Finally, step 415 is executed in which the clock overlapping points are electrically connected according to a clock connection manner of the malfunctioned first shift register. In step 407, if there is no first shift register determined malfunctioning, then step 413 is executed to skip the flow path.

In addition to the steps shown in FIG. 4, the third embodiment is capable of performing all the operations or functions recited in the first embodiment. Those skilled in the art can straightforwardly realize how the third embodiment performs these operations and functions based on the above descriptions of the first embodiment. Therefore, the descriptions for these operations and functions are redundant and not repeated herein.

Figure 5:
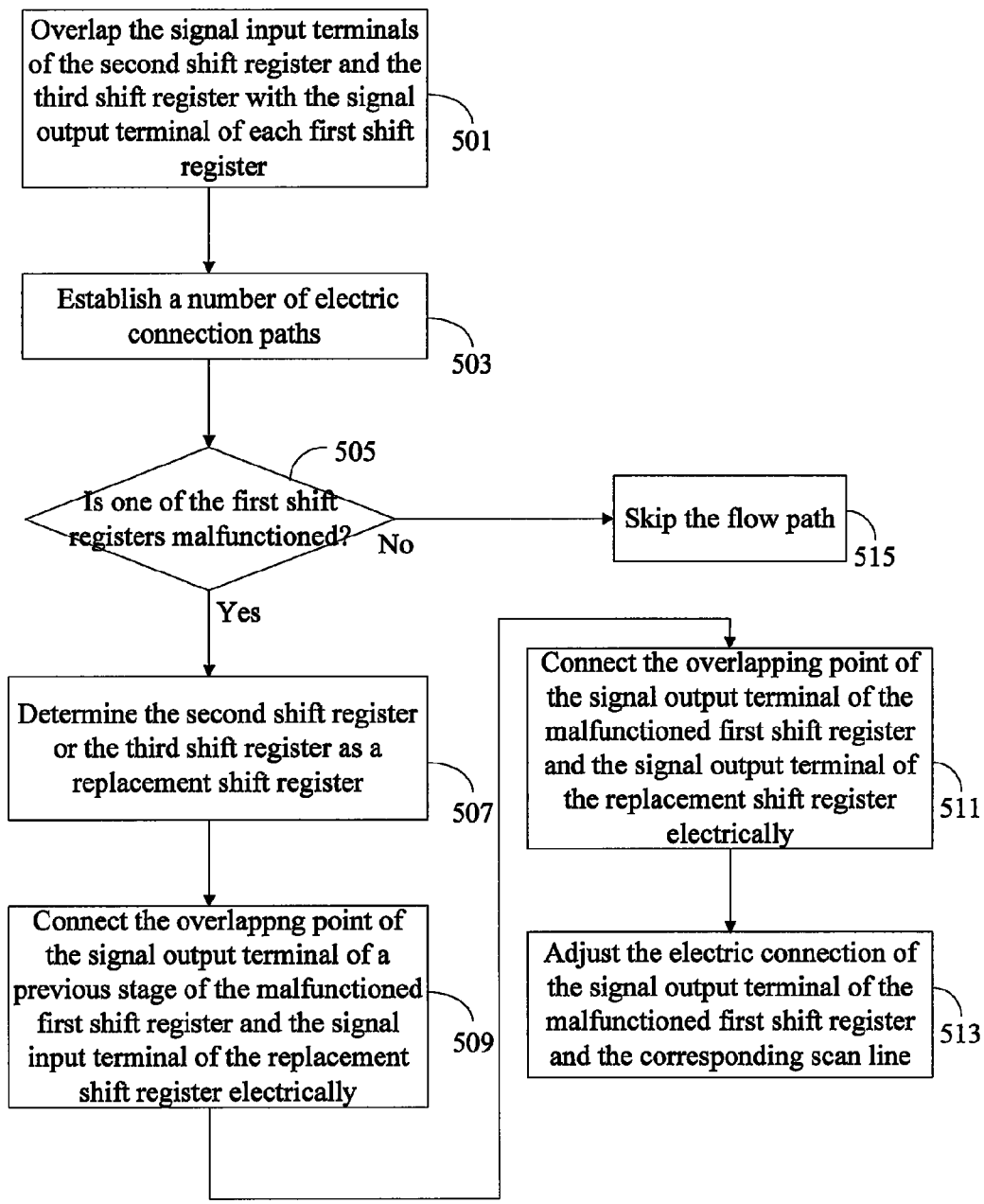
FIG. 5 is a flow chart illustrating a fourth embodiment of the present invention.

As shown in FIG. 5, a fourth embodiment of the present invention is a method for driving a pixel array by a shift register array in a display device, such as the display device 3 of the second embodiment. The method is described as follows.

In step 501, the signal input terminals of the second shift register and the third shift register overlap the signal output terminal of each first shift register without electric connection. In step 503, a number of electric connection paths are established, wherein each electric connection path overlaps the signal output terminals of the second shift register and the third shift register with the signal output terminal of one of the first shift registers without electric connection. The number of the electric connection paths is the same as the number of the first shift registers. In step 505, one of the first shift registers is determined whether malfunctioning. If yes, step 507 is executed in which the second shift register or the third shift register is determined as a replacement shift register according to a clock connection manner of the malfunctioned first shift register. Then step 509 is executed in which the overlapping point of the signal output terminal of a previous stage of the malfunctioned first shift register and the signal input terminal of the replacement shift register is electrically connected. In step 511, the overlapping point of the signal output terminal of the malfunctioned first shift register and the signal output terminal of the replacement shift register is electrically connected. Finally, step 513 is executed in which the electric connection of the signal output terminal of the malfunctioned first shift register and the corresponding scan line is adjusted to electric disconnection. In step 507, if there is no first shift register determined malfunctioning, then step 515 is executed to skip the flow path.

In addition to the steps shown in FIG. 5, the fourth embodiment is capable of performing all the operations or functions recited in the second embodiment. Those skilled in the art can straightforwardly realize how the fourth embodiment performs these operations and functions based on the above descriptions of the second embodiment. Therefore, the descriptions for these operations and functions are redundant and not repeated herein.

The present invention is not limited to the kinds of pixel arrays. The pixel arrays of the above embodiments may be an organic light-emitting diode array, a liquid crystal array, or other kinds of light emitting arrays.

Accordingly, the present invention replaces the shift register malfunctioned during the flat panel display device manufacturing process by using at least a backup shift register. The backup shift register can be pre-implanted close to the first shift registers, and be wired up to the first shift registers and the pixel array. When one of the first shift registers malfunctions, some of the overlapping points and connection lines are connected or cut. The goal that the display device operates normally can be achieved thereby.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A display device, comprising:
a pixel array comprising a plurality of scan lines; and
a shift register array, comprising:
a plurality of first shift registers, each first shift register comprising a signal input terminal and a signal output terminal, the signal output terminal being predetermined to be electrically connected with corresponding one of the scan lines;
a second shift register comprising a signal input terminal and a signal output terminal;
a first connection line, connected to the signal input terminal of the second shift register, for overlapping the signal output terminal of each first shift register without electric connection;
a second connection line connected to the signal output terminal of the second shift register; and
a third connection line for establishing a plurality of electric connection paths with the second connection line, and overlapping the signal output terminal of each first shift register without electric connection, wherein the number of the electric connection paths is the same as the number of the first shift registers;
wherein when one of the first shift registers malfunctions, the overlapping point of the signal output terminal of a previous stage of the malfunctioned first shift register is electrically connected to the first connection line, the overlapping point of the signal output terminal of the malfunctioned first shift register is electrically connected to the third connection line, and the electric connection of the signal output terminal of the malfunctioned first shift register and the corresponding scan line is adjusted to electric disconnection.

2. The display device as claimed in claim 1, the shift register array further comprising:
a positive clock signal connection line for supplying a positive clock to the first shift registers; and
a negative clock signal connection line for supplying a negative clock to the first shift registers;
wherein the second shift register comprises a first clock input terminal and a second clock input terminal, the positive clock signal connection line and the negative clock signal connection line overlap the first clock input terminal and the second clock input terminal respectively without electric connection, and the clock overlapping points are determined whether to be adjusted to electric connection according to a clock connection manner of the malfunctioned first shift register.

3. The display device as claimed in claim 1, wherein the electric connection of the signal output terminal of the malfunctioned first shift register and the corresponding scan line is adjusted to electric disconnection by cutting with a laser beam.

4. The display device as claimed in claim 1, wherein the pixel array comprises an organic light-emitting diode array.

5. The display device as claimed in claim 1, wherein the pixel array composes a liquid crystal array.

6. A display device, comprising:
a pixel array comprising a plurality of scan lines; and
a shift register array, comprising:
a plurality of first shift registers, each first shift register comprising a signal input terminal and a signal output terminal, the signal output terminal being predetermined to be electrically connected with corresponding one of the scan lines;
a positive clock signal connection line for supplying a positive clock to the first shift registers;
a negative clock signal connection line for supplying a negative clock to the first shift registers;
a second shift register comprising a signal input terminal, a signal output terminal, a first clock input terminal, and a second clock input terminal, the first clock input terminal of the second shift register being electrically connected to the positive clock signal connection line, the second clock input terminal of the second shift register being electrically connected to the negative clock signal connection line;
a third shift register having a signal input terminal, a signal output terminal, a first clock input terminal, and a second clock input terminal, the first clock input terminal of the third shift register being electrically connected to the negative clock signal connection line, the second clock input terminal of the third shift register being electrically connected to the positive clock signal connection line;
a first connection line, connected to the signal input terminals of the second shift register and the third shift register, for overlapping the signal output terminal of each first shift register without electric connection;
a second connection line for overlapping the signal output terminals of the second shift register and the third shift register without electric connection; and
a third connection line for establishing a plurality of electric connection paths with the second connection line, and overlapping the signal output terminal of each first shift register without electric connection, wherein the number of the electric connection paths is the same as the number of the first shift registers;
wherein when one of the first shift registers malfunctions, the second shift register or the third shift register is determined to be a replacement shift register according to a clock connection manner of the malfunctioned first shift register, the overlapping point of the signal output terminal of a previous stage of the malfunctioned first shift register is electrically connected to the first connection line, the overlapping point of the signal output terminal of the malfunctioned first shift register is electrically connected to the third connection line, the electric connection of the signal output terminal of the malfunctioned first shift register and the corresponding scan line is adjusted to electric disconnection, and the overlapping point of the signal output terminal of the replacement shift register is electrically connected to the second connection line.

7. The display device as claimed in claim 6, wherein the electric connection of the signal output terminal of the malfunctioned first shift register and the corresponding scan line is adjusted to electric disconnection by cutting with a laser beam.

8. The display device as claimed in claim 6, wherein the pixel array comprises an organic light-emitting diode array.

9. The display device as claimed in claim 6, wherein the pixel array comprises a liquid crystal array.

10. A shift register array for driving a pixel array comprising a plurality of scan lines, comprising:
- a plurality of first shift registers, each first shift register comprising a signal input terminal and a signal output terminal, the signal output terminal being predetermined to be electrically connected with corresponding one of the scan lines;
- a second shift register comprising a signal input terminal and a signal output terminal;
- a first connection line, electrically connected to the signal input terminal of the second shift register, for overlapping the signal output terminal of each first shift register without electric connection;
- a second connection line electrically connected to the signal output terminal of the second shift register; and
- a third connection line for establishing a plurality of electric connection paths with the second connection line, and overlapping the signal output terminal of each first shift register without electric connection, wherein the number of the electric connection paths is the same as the number of the first shift registers;
- wherein when one of the first shift registers malfunctions, the overlapping point of the signal output terminal of a previous stage of the malfunctioned first shift register is electrically connected to the first connection line, the overlapping point of the signal output terminal of the malfunctioned first shift register is electrically connected to the third connection line, and the electric connection of the signal output terminal of the malfunctioned first shift register and the corresponding scan line is adjusted to electric disconnection.

11. The shift register array as claimed in claim 10, further comprising:
- a positive clock signal connection line for supplying a positive clock to the first shift registers; and
- a negative clock signal connection line for supplying a negative clock to the first shift registers;
- wherein the second shift register comprises a first clock input terminal and a second clock input terminal, the positive clock signal connection line and the negative clock signal connection line overlap the first clock input terminal and the second clock input terminal respectively without electric connection, and the clock overlapping points are determined whether to be adjusted to electric connection according to a clock connection manner of the malfunctioned first shift register.

12. The shift register array as claimed in claim 10, wherein the electric connection of the signal output terminal of the malfunctioned first shift register and the corresponding scan line is adjusted to electric disconnection by cutting with a laser beam.

13. The shift register array as claimed in claim 10, wherein the pixel array comprises an organic light-emitting diode array.

14. The shift register array as claimed in claim 10, wherein the pixel array comprises a liquid crystal array.

15. A shift register array for driving a pixel array comprising a plurality of scan lines, comprising:
- a plurality of first shift registers, each first shift register comprising a signal input terminal and a signal output terminal, the signal output terminal being predetermined to be electrically connected with corresponding one of the scan lines;
- a positive clock signal connection line for supplying a positive clock to the first shift registers;
- a negative clock signal connection line for supplying a negative clock to the first shift registers;
- a second shift register comprising a signal input terminal, a signal output terminal, a first clock input terminal, and a second clock input terminal, the first clock input terminal of the second shift register being electrically connected to the positive clock signal connection line, the second clock input terminal of the second shift register being electrically connected to the negative clock signal connection line;
- a third shift register having a signal input terminal, a signal output terminal, a first clock input terminal, and a second clock input terminal, the first clock input terminal of the third shift register being electrically connected to the negative clock signal connection line, the second clock input terminal of the third shift register being electrically connected to the positive clock signal connection line;
- a first connection line, connected to the signal input terminals of the second shift register and the third shift register, for overlapping the signal output terminal of each first shift register without electric connection;
- a second connection line for overlapping with the signal output terminals of the second shift register and the third shift register without electric connection; and
- a third connection line for establishing a plurality of electric connection paths with the second connection line, and overlapping the signal output terminal of each first shift register without electric connection, wherein the number of the electric connection paths is the same as the number of the first shift registers;
- wherein when one of the first shift registers malfunctions, the second shift register or the third shift register is determined to be a replacement shift register according to a clock connection manner of the malfunctioned first shift register, the overlapping point of the signal output terminal of a previous stage of the malfunctioned first shift register is electrically connected to the first connection line, the overlapping point of the signal output terminal of the malfunctioned first shift register is electrically connected to the third connection line, the electric connection of the signal output terminal of the malfunctioned first shift register and the corresponding scan line is adjusted to electric disconnection, and the overlapping point of the signal output terminal of the replacement shift register is electrically connected to the second connection line.

16. The shift register array as claimed in claim 15, wherein the electric connection of the signal output terminal of the malfunctioned first shift register and the corresponding scan line is adjusted to electric disconnection by cutting with a laser beam.

17. The shift register array as claimed in claim 15, wherein the pixel array comprises an organic light-emitting diode array.

18. The shift register array as claimed in claim 15, wherein the pixel array comprises a liquid crystal array.

19. A method for driving a pixel array by a shift register array, the pixel array comprising a plurality of scan lines, the shift register array comprising a plurality of first shift registers and a second shift register, a first connection line, a second connection line and a third connection line, each first shift register and the second shift register comprising a signal input terminal and a signal output terminal, the signal output terminal of each first shift register being predetermined to be electronically connected with corresponding one of the scan lines, the first connection line being connected to the signal input terminal of the second shift register for overlapping the signal output terminal of each first shift register without electronic connection, the second connection line being connected to the signal output terminal of the second shift register, the method comprising the steps of:

enabling the third connection line to overlap the signal input terminals of the second shift register and the signal output terminal of each first shift register without electronic connection;

enabling the third connection line to establish a plurality of electronic connection paths with the second connection line, wherein the number of the electronic connection paths is the same as the number of the first shift registers; and determining whether one of the first shift registers malfunctions, if yes, going to the following steps:

adjusting the overlap point of the signal output terminal of a previous stage of the malfunctioned first shift register and the signal input terminal of the second shift register to electronic connection;

adjusting the overlap point of the signal output terminal of the malfunctioned first shift register and the signal output terminal of the second shift register to electronic connection; and adjusting the electronic connection of the signal output terminal of the malfunctioned first shift register and the corresponding scan line to electronic disconnection.

20. The method as claimed in claim 19, the shift register array further comprising a positive clock signal connection line and a negative clock signal connection line, the positive clock signal connection line supplying a positive clock to the first shift registers, the negative clock signal connection line supplying a negative clock to the first shift registers, the second shift register comprising a first clock input terminal and a second clock input terminal, the method further comprising the steps of:

overlapping the positive clock signal connection line and the negative clock signal connection line with the first clock input terminal and the second clock input terminal respectively without electronic connection; and adjusting the clock overlap points to electronic connection according to a clock connection manner of the malfunctioned first shift register if one of the first shift registers malfunctions.

21. A method for driving a pixel array by a shift register array, the pixel array comprising a plurality of scan lines, the shift register array comprising a plurality of first shift registers, a second shift register, a third shift register, a positive clock signal connection line, and a negative clock signal connection line, a first connection line, a second connection line and a third connection line, each first shift register comprising a signal input terminal and a signal output terminal, the second shift register and the third shift register respectively comprising a signal input terminal, a signal output terminal, a first clock input terminal, and a second clock input terminal, the signal output terminal of each first shift register being predetermined to be electronically connected with corresponding one of the scan lines, the first clock input terminal of the second shift register being electrically connected to the positive clock signal connection line, the second clock input terminal of the second shift register being electrically connected to the negative clock signal connection line, the first clock input terminal of the third shift register being electrically connected to the negative clock signal connection line, and the second clock input terminal of the third shift register being electrically connected to the positive clock signal connection line, the first connection line being connected to the signal input terminal of the second and the third shift register for overlapping the signal output terminal of each first shift register without electronic connection, the second connection line being connected to the signal output terminal of the second shift register and the third shift register, the method comprising the steps of:

enabling the third connection line to overlap the signal input terminals of the second shift register and the third shift register and the signal output terminal of each first shift register without electronic connection;

enabling the third connection line to establish a plurality of electronic connection paths with the second connection line, wherein the number of the electronic connection paths is the same as the number of the first shift registers; and determining whether one of the first shift registers malfunction, if yes, going to the following steps:

determining the second shift register or the third shift register as a replacement shift register according to a clock connection manner of the malfunctioned first shift register;

adjusting the overlap point of the signal output terminal of a previous stage of the malfunctioned first shift register and the signal input terminal of the replacement shift register to electronic connection;

adjusting the overlap point of the signal output terminal of the malfunctioned first shift register and the signal output terminal of the replacement shift register to electronic connection; and adjusting the electronic connection of the signal output terminal of the malfunctioned first shift register and the corresponding scan line to electronic disconnection.

* * * * *